(12) United States Patent
Yamazaki et al.

(10) Patent No.: US 6,818,733 B2
(45) Date of Patent: Nov. 16, 2004

(54) POLYMERIC FLUORESCENT SUBSTANCE AND POLYMER LIGHT-EMITTING DEVICE USING THE SAME

(75) Inventors: Michio Yamazaki, Chiyokawa-mura (JP); Shuji Doi, Tsukuba (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/883,275

(22) Filed: Jun. 19, 2001

(65) Prior Publication Data

US 2002/0033665 A1 Mar. 21, 2002

(30) Foreign Application Priority Data

Jun. 22, 2000 (JP) ........................................ 2000-187475

(51) Int. Cl.$^7$ .............................................. C08G 61/10
(52) U.S. Cl. ........................ 528/396; 528/205; 428/917
(58) Field of Search ........................... 525/205; 428/690

(56) References Cited

U.S. PATENT DOCUMENTS

| | | | | | |
|---|---|---|---|---|---|
| 4,519,938 | A | * | 5/1985 | Papir ........................... | 252/500 |
| 5,917,003 | A | * | 6/1999 | Gelan et al. ................. | 528/330 |
| 5,945,502 | A | * | 8/1999 | Hsieh et al. ................. | 528/101 |
| 6,326,091 | B1 | * | 12/2001 | Schoo et al. ................. | 428/690 |
| 6,458,909 | B1 | * | 10/2002 | Spreitzer et al. ............ | 526/285 |
| 2001/0041269 | A1 | * | 11/2001 | Berntsen et al. ............ | 428/690 |

FOREIGN PATENT DOCUMENTS

| | | | |
|---|---|---|---|
| DE | 98/27136 | 6/1998 | |
| DE | 99/21936 | 5/1999 | |
| DE | 99/24526 | 5/1999 | |
| EP | 0 825 242 A2 | 2/1998 | |
| EP | 0 825 242 A3 | 7/1998 | |
| EP | 0 901 174 A2 | 3/1999 | |
| WO | 99/24526 A1 | * 5/1999 | ........... C09K/11/06 |

OTHER PUBLICATIONS

Oguma et al., "Synthesis and properties of liquid crystalline poly (p–phenylene) and poly(p–phenylenevinylene) derivatives," *Synthetic Metals*, vol. 101, (1999), pp. 86–87.

Park et al., "Steady state photoconductivity of Poly(2–styryl–1, 4– phenylene vinylene) (PSPV)," *Synthetic Metals*, vol. 84, (1997), pp. 965–966.

Yoon et al., "New light emitting poly(1,4–phenylenevinylene) derivative containing trifluoromethylstilbene group in the side chain," *Synthetic Metals*, vol. 111–112, (2000), pp. 469–471.

Yang et al., "Color–variable electroluminescence from poly(p–phenylene vinylene) derivatives," *Displays*, vol. 21, (2000), pp. 65–68.

* cited by examiner

*Primary Examiner*—David W. Wu
*Assistant Examiner*—Rip A. Lee
(74) *Attorney, Agent, or Firm*—Sughrue Mion, PLLC

(57) ABSTRACT

A polymeric fluorescent substance exhibiting fluorescence in solid state. The substance has a polystyrene reduced number-average molecular weight of $5 \times 10^4$ to $1 \times 10^8$, and contains repeating units represented by formula (1) and formula (3):

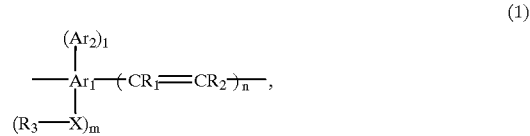

(1)

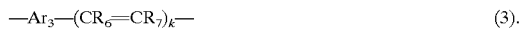

(3).

The polymeric fluorescent substance exhibits particularly strong fluorescence, and a high performance polymer LED which can be driven at low voltage and high efficiency is obtained.

2 Claims, No Drawings

POLYMERIC FLUORESCENT SUBSTANCE AND POLYMER LIGHT-EMITTING DEVICE USING THE SAME

BACKGROUND OF THE INVENTION

1. Field of the Invention

The present invention relates to a polymeric fluorescent substance and more specifically a polymer light-emitting device using the same (hereinafter, sometimes referred to as polymer LED).

2. Description of Related Art

Inorganic electroluminescence devices (hereinafter, sometimes referred to as inorganic EL device) using an inorganic luminescent material as a light emitting material have been used, for example, for flat light sources as back-lights and displays such as a flat panel display and the like. However, an alternating current of high voltage has been required for light emission.

Recently, an organic electroluminescence device (hereinafter, sometimes referred to as organic EL device) has been fabricated having a double-layer structure in which an organic fluorescent dye as a light emitting layer is laminated with an organic charge transport compound used in a photosensitive layer for electrophotography and the like (Japanese Patent Application Laid-Open (JP-A) No. 59-194393). Organic EL devices can emit a lot of colors easily with low driving voltage and high luminance, as compared with inorganic EL devices. Therefore a lot of trials have been reported regarding device structures, organic fluorescent dyes and organic charge transport compounds of organic EL devices [Jpn. J. Appl. Phys., 27, L269 (1988), J. Appl. Phys., 65, 3610 (1989)].

Further, in addition to organic EL devices using mainly organic compounds having a lower molecular weight, polymer light emitting devices (hereinafter, sometimes referred to as polymer LEDs) using light emitting materials having a higher molecular weight have been proposed in for example WO 9013148, JP-A No. 3-244630, Appl. Phys. Lett., 58, 1982 (1991). WO 9013148 discloses in the examples thereof an EL device using a thin film of poly(p-phenylene vinylene) obtained by forming a film of a soluble precursor on the electrode and subjecting it to a heat treatment to convert the precursor into a conjugated polymer.

Further, JP-A No. 3-244630 contains examples of conjugated polymers which are themselves soluble in a solvent and needs no heat treatment. Also, in Appl. Phys. Lett., 58, 1982 (1991), a polymeric light emitting materials soluble in a solvent and a polymer LED fabricated using the same are described.

The polymeric fluorescent substance used in these polymer LEDs include polyfluorenes (Japanese Journal of Applied Physics, 30, L1941 (1991)), poly(p-phenylene) derivatives (Advanced Materials, 4, 36 (1992)) and the like, in addition to the above-mentioned poly(p-phenylene vinylene).

A light emitting layer can be easily produced for a polymer LED using a solvent-soluble polymeric fluorescent substance or precursor thereof, therefore, it is advantageous for increased area and decreased cost, as compared with vapor-deposition of a fluorescent substance of low molecular weight, and is also excellent in mechanical strength of the resulting film since it is a polymer.

Recently, there has been disclosed copolymers containing a polyarylenevinylene having an aryl group and a substituent on an arylene group constituting the main chain of the polyarylenevinylene, as a polymeric fluorescent substance (WO98/27136, WO99/24526).

These copolymers are excellent in light emitting property but stronger fluorescence is desired.

An object of the present invention is to provide a polymeric fluorescent substance composed of a copolymer containing an arylene or arylenevinylene having an aryl group, heterocyclic compound group or substituent on an arylene group constituting the main chain, and exibiting strong fluorescent, and to provide a high performance polymer LED which can be driven at low voltage and high efficiency using this polymeric fluorescent substance.

SUMMARY OF THE INVENTION

The above object and other objectives have been achieved by the present inventors who have intensively studied, in view of the above-mentioned conditions, and found that a polymeric fluorescent substance having the repeating units as described herein exibit particularly strong fluorescence, and that a high performance polymer LED which can be driven at low voltage and high efficiency can be obtained by using this polymeric fluorescent substance.

Namely, in accordance with the present invention there is provided a polymeric fluorescent substance exhibiting fluorescence in solid state. The substance has a polystyrene reduced number-average molecular weight of $5 \times 10^4$ to $1 \times 10^8$, and containing one or more repeating units of the following general formula (1) and one or more repeating units of the following general formula (3), the total amount of the repeating units being 50 mol % or more based on the total amount of all repeating units, and the total amount of repeating units of the general formula (1) being 0.1 mol % to 15 mol % based on the total amount of repeating units of the general formulae (1) and (3):

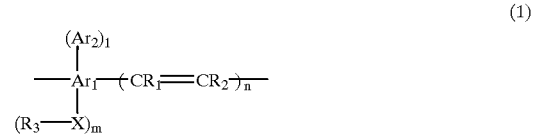

(1)

wherein, $Ar_1$ represents an arylene group having 6 to 60 carbon atoms contained in the main chain part or a divalent heterocyclic compound group having 4 or more and 60 or less carbon atoms contained in the main chain part. $Ar_2$ represents an aryl group having 6 to 60 carbon atoms or a heterocyclic compound group having 4 to 60 carbon atoms. $Ar_2$ may further have a substituent. l represents an integer from 1 to 4, and m represents an integer from 1 to 4, however, l+m does not exceed the maximum possible number of substituents on $Ar_1$ in the formula (1), X represents an oxygen atom, sulfur atom or a group of the following general formula (2), $R_3$ represents a group selected from the group consisting of alkyl groups having 1 to 20 carbon atoms, aryl groups having 6 to 60 carbon atom, arylalkyl groups having 7 to 60 carbon atoms and heterocyclic compound groups having 4 to 60 carbon atoms, each of $R_1$ and $R_2$ independently represents a group selected from the group consisting of a hydrogen atom, an alkyl group having 1 to 20 carbon atoms, an aryl groups having 6 to 60 carbon atoms, a heterocyclic compound groups having 4 to 60 carbon atoms and a cyano group. n is 0 or 1,

(2)

wherein, each of $R_4$ and $R_5$ independently represents a group selected from the group consisting of a hydrogen atom, an alkyl group having 1 to 20 carbon atoms, an aryl group having 6 to 60 carbon atoms, a heterocyclic compound group having 4 to 60 carbon atoms and a cyano group,

$$—Ar_3—(CR_6=CR_7)_k— \quad (3)$$

wherein, $Ar_3$ represents an arylene group having 6 to 60 carbon atoms contained in the main chain part thereof or a heterocyclic compound group having 4 to 60 carbon atoms contained in the main chain part. $Ar_3$ may have a substituent, however, does not simultaneously have substituents represented by $—Ar_2$ and $—X—R_3$ in the formula (1), each of $R_6$ and $R_7$ independently represents a group selected from the group consisting of a hydrogen atom, an alkyl group having 1 to 20 carbon atoms, an aryl group having 6 to 60 carbon atoms, a heterocyclic compound group having 4 to 60 carbon atoms and a cyano group, and k is 0 or 1.

The present invention also provides a polymer light emitting device comprising a pair of electrodes composed of an anode and a cathode one or both which is transparent or semitransparent, and one or more light emitting layers disposed between the electrodes, wherein the polymeric fluorescent substance described above is contained in said light emitting layer.

The present invention provides a flat light source, a segment display, and a dot matrix display all obtained by using the polymer light emitting device. The present invention also provides a liquid crystal display obtained by using the polymer light emitting device as a back-light.

DETAILED DESCRIPTION OF THE PREFERRED EMBODIMENTS

The polymeric fluorescent substance of the present invention, and a polymer LED obtained by using the polymeric fluorescent substance will be described in detail below.

The polymeric fluorescent substance of the present invention is a polymeric fluorescent substance exhibiting fluorescence in solid state, and having a polystyrene reduced number-average molecular weight of $5 \times 10^4$ to $1 \times 10^8$, The polymeric fluorescent substance contains one or more repeating units of the above-mentioned general formula (1) and one or more repeating units of the above-mentioned general formula (3), the total amount of the repeating units being 50 mol % or more based on the total amount of all repeating units, and the total amount of repeating units of the general formula (1) being 0.1 mol % to 15 mol % based on the total amount of repeating units of the general formulae (1) and (3). Depending on the structure of the repeating units, the amount of repeating units of the general formula (1) is preferably 0.2 mol % to and 12 mol %.

Preferably, the repeating units of formulae (1) and (3) are so selected that, when the absorption edge wavelength of a polymer containing only repeating units of the general formula (1) is represented by $\lambda_1$ (nm) and the absorption edge wavelength of a polymer containing only repeating units of the general formula (3) is represented by $\lambda_2$ (nm), the following relation is satisfied:

$$1239/\lambda_2 \geq 1239/\lambda_1 + 0.050.$$

When the above realtion is satisfied, the polymeric fluorescent substance of the present invention exhibits more stronger fluorescence.

When there are a plurality of repeating units of the general formula (1) and/or repeating units of the general formula (3), all of repeating units of the general formula (1) and/or repeating units of the general formula (3) satisfy the above-mentioned relation. For obtaining the absorption edge wavelength of a polymer, the absorption spectrum of a thin film of this polymer is measured, and the wavelength revealing rising of absorption from the base line is read. Specifically, for example, a solution of a polymeric fluorescent substance is spin-coated on a quartz plate to form a thin film having a thickness of about 50 to 300 nm, and absorption spectrum is measured. The wavelength at the intersection point of straight lines respectively adjacent to the base line and the rising part of absorption of this spectrum is referred to as the absorption edge wavelength. Further, the inverse number of the absorption edge wavelength (nm) can be multiplied by 1239 to convert the magnitude of the minimum energy necessary for excitation of this polymer into a number represented in terms of electron volt (eV).

$Ar_2$ represents an aryl group having 6 to 60 carbon atoms or a heterocyclic compound group having 4 to 60 carbon atoms. $Ar_2$ may further have a substituent. Specific examples of substituents which $Ar_2$ may have include linear, branched or cyclic alkyl groups having 1 to 20 carbon atoms, linear, branched or cyclic alkoxy groups having 1 to 20 carbon atoms, linear, branched or cyclic alkylthio groups having 1 to 20 carbon atoms, mono, di or tri-alkylsilyl groups having 1 to 60 carbon atoms, mono or di-alkylamino groups having 1 to 40 carbon atoms, aryl groups having 6 to 60 carbon atoms, aryloxy groups having 6 to 60 carbon atoms, arylalkyl groups having 7 to 60 carbon atoms, arylalkoxy groups having 7 to 60 carbon atoms, arylamino groups having 6 to 60 carbon atoms, heterocyclic compound groups having 4 to 60 carbon atoms and cyano groups. The aryl group, aryloxy group, arylalkyl group, arylalkoxy group, arylamino group and heterocyclic compound group may further have a substituent, and further, a carbon atom on all of the groups may be substituted by an oxygen atom or sulfur atom. Specific examples of $Ar_2$ include a phenyl group, a naphthyl group, an anthracenyl group, a phenanthrenyl group, a pyrenyl group and the like.

Each of $Ar_1$ and $Ar_3$ independently represents an arylene group having 6 to 60 carbon atoms contained in the main chain or a heterocyclic compound group having 4 to 60 carbon atoms contained in the main chain.

$Ar_1$ and $Ar_3$ may be advantageously selected so that the fluorescent property of the polymeric fluorescent substance does not deteriorate, and as specific examples, divalent groups exemplified in the following chemical formulae 7 to 20.

Chemical Formula 7

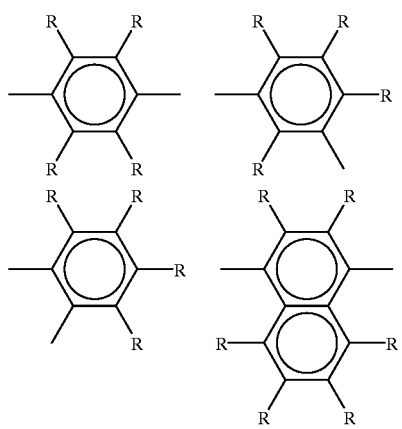

-continued
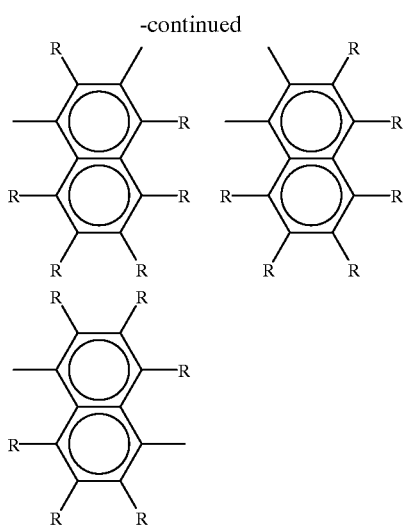
Chemical formula 8
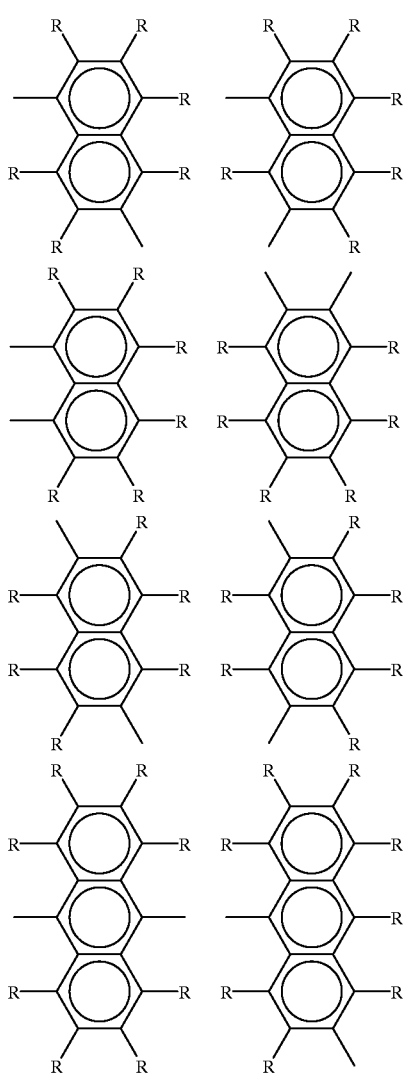
Chemical Formula 9
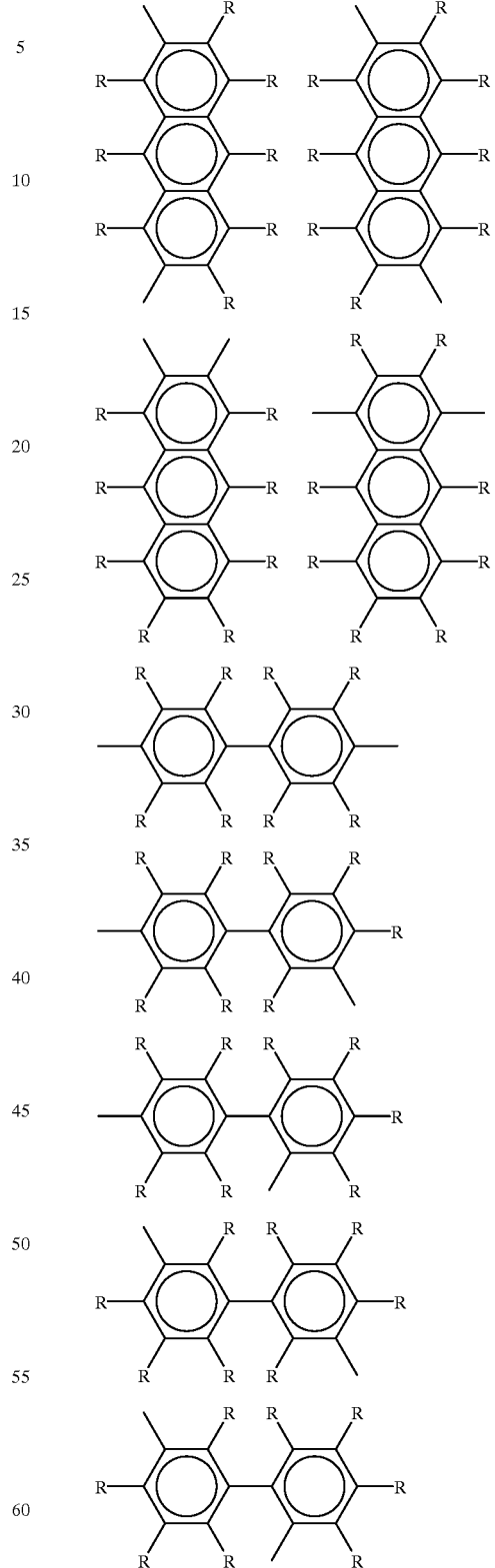

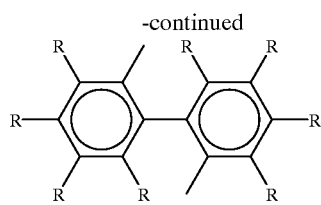
Chemical Formula 10
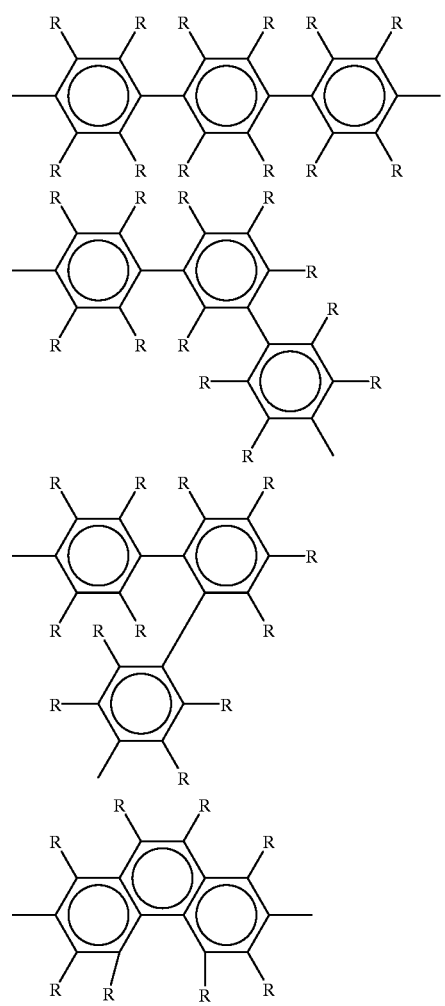
Chemical Formula 11
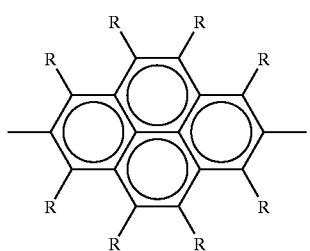
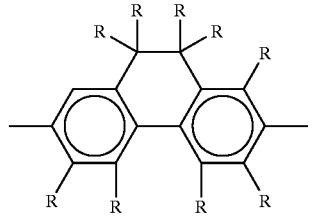
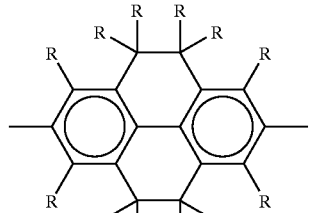
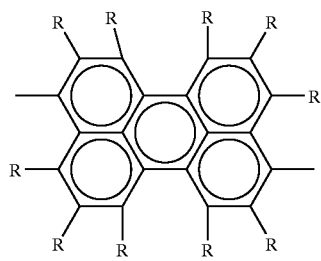
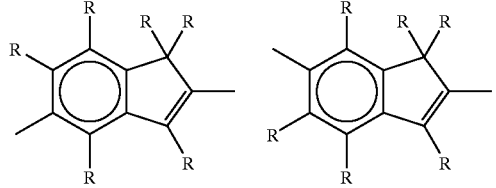
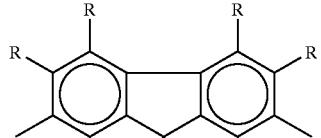
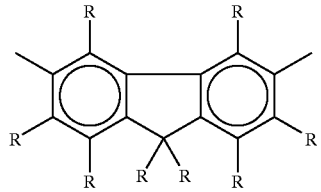
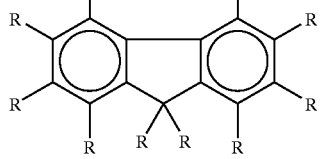

Chemical Formula 12
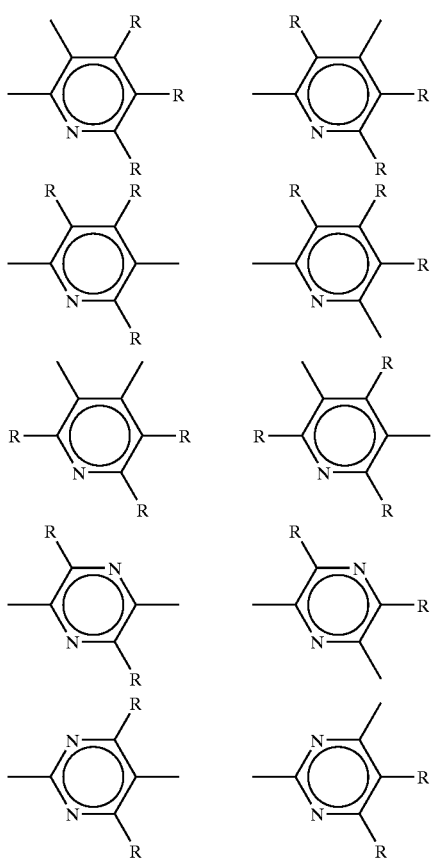
Chemical Formula 13
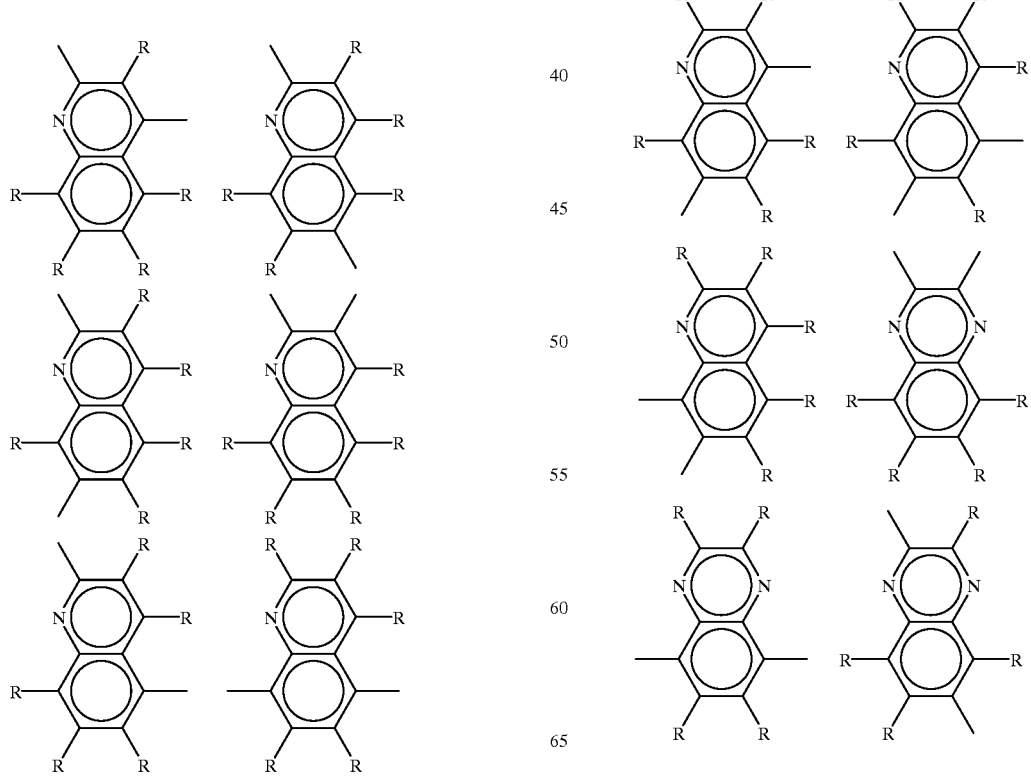
Chemical Formula 14
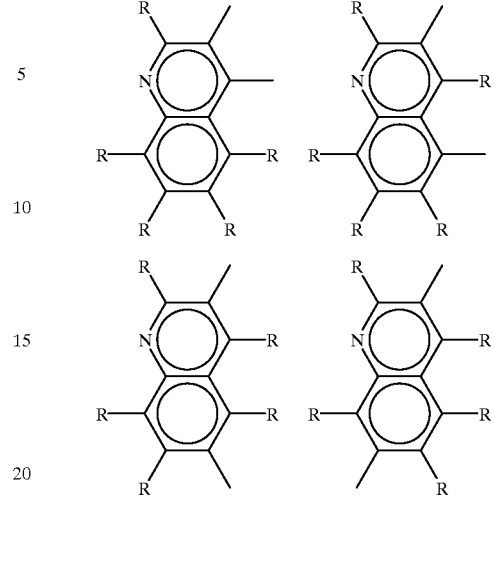

-continued
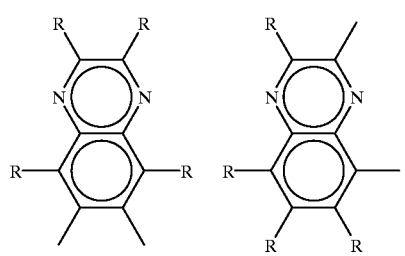
Chemical Formula 15
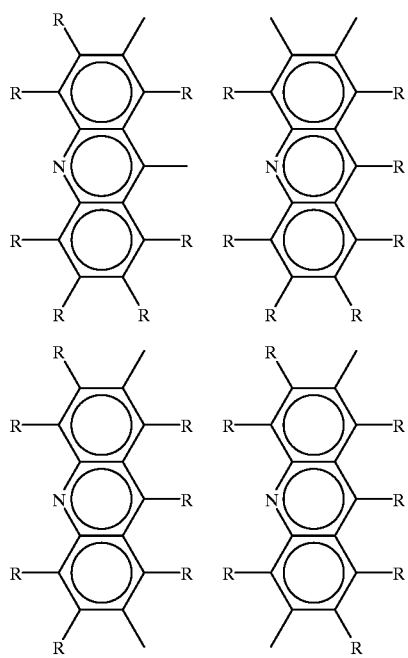
Chemical Formula 16
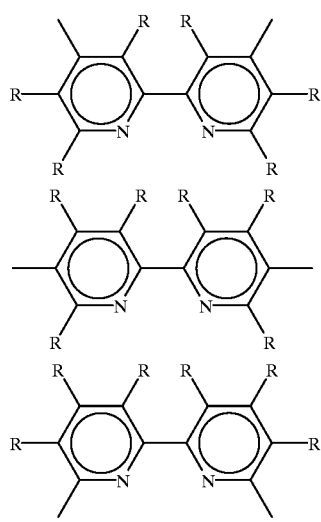
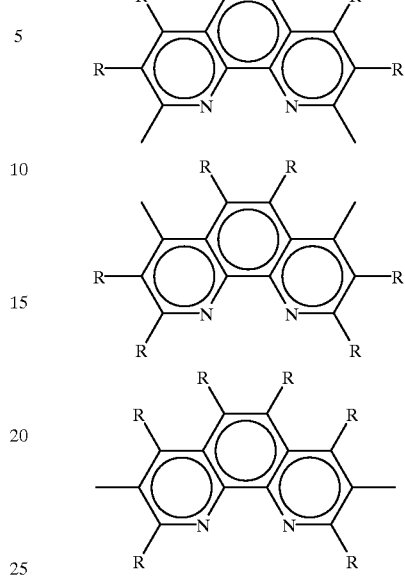
Chemical Formula 17
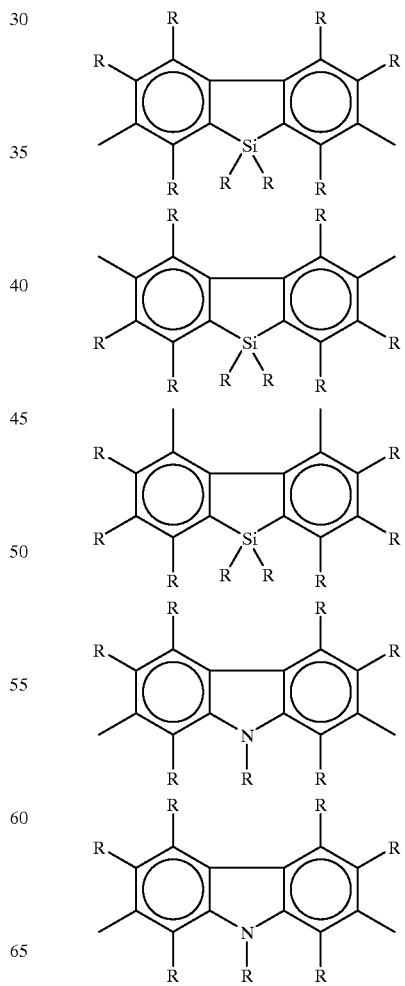

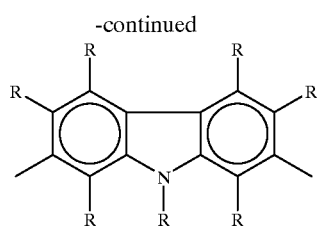
Chemical Formula 18
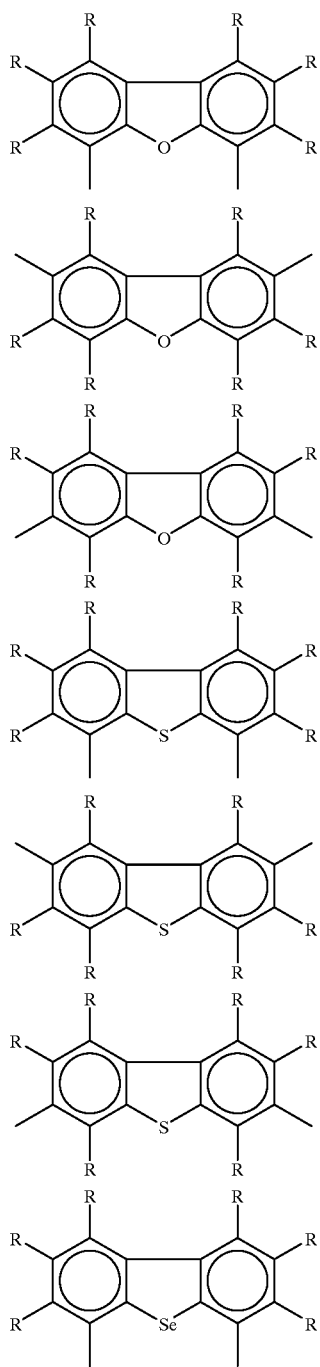
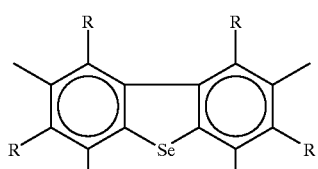
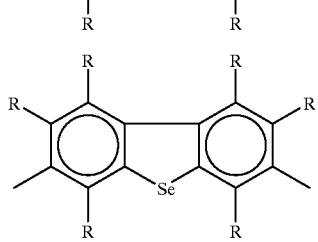
Chemical Formula 19
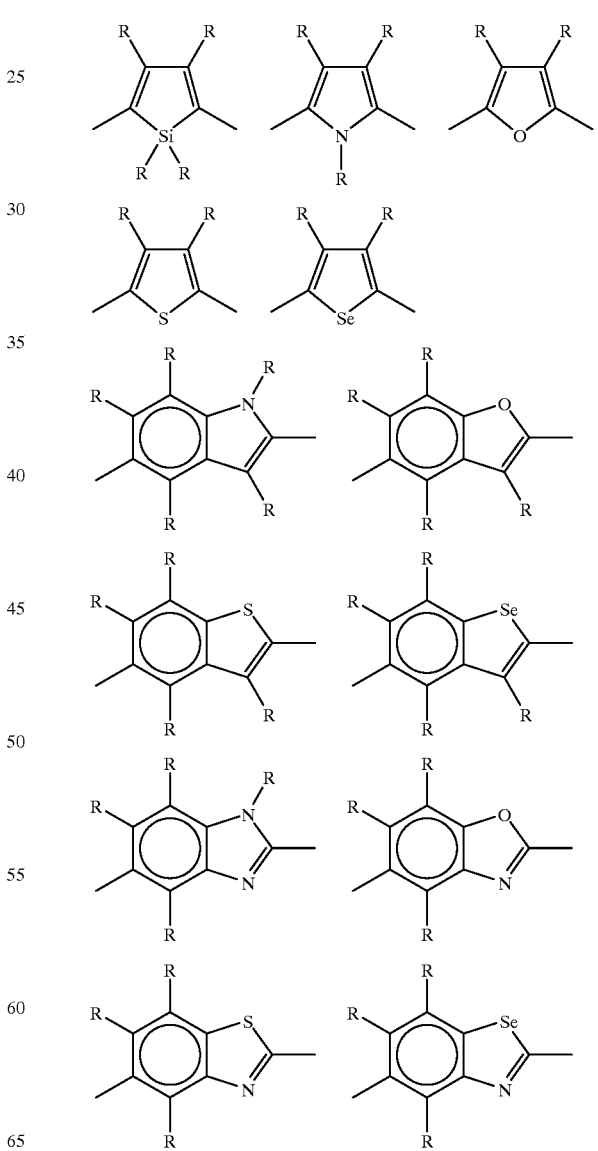

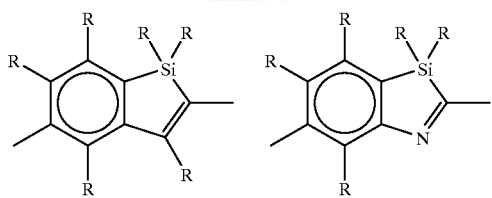

Chemical Formula 20

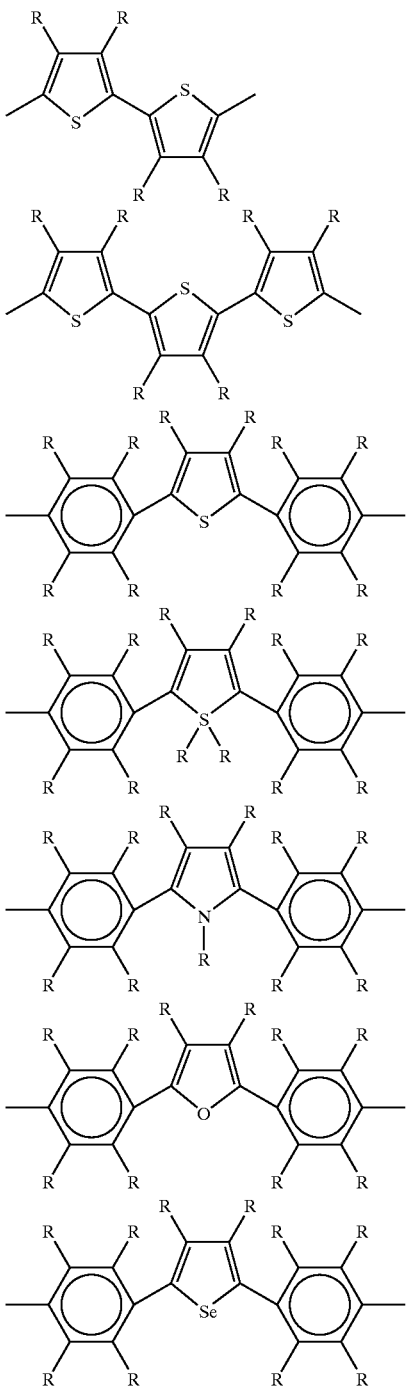

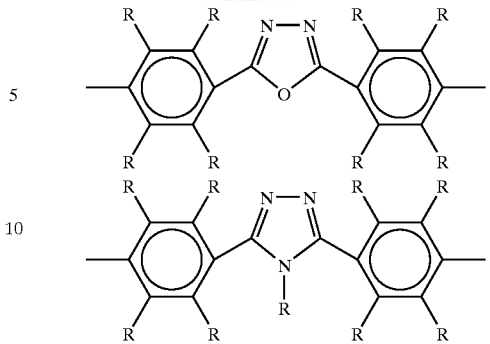

In the case of $Ar_1$, R represents a hydrogen atom or substituent, and it is so selected that $Ar_1$ has 1 to 4 substituents of —$Ar_2$ and 1 to 4 substituents of —X—$R_3$. However, the total number (1+m) of these substituents does not exceed the possible maximum number of substituents on $Ar_1$. In the above-mentioned examples, a plurality of R groups are present on one structural formula, and they may be the same or different, and selected independently of each other. For enhancing solubility in a solvent, it is preferable that the form of repeating units containing substituents has less symmetric property.

X represents an oxygen atom, sulfur atom or group of the above formula (2), with an oxygen atom being particularly preferable.

$R_3$ represents a group selected from the group consisting of alkyl groups having 1 to 20 carbon atoms, aryl groups having 6 to 60 carbon atoms, arylalkyl groups having 7 to 60 carbon atoms and heterocyclic compound groups having 4 to 60 carbon atoms.

When R represents a substituent other than a hydrogen atom and a cyano group, regarding specific substituents, examples of the alkyl groups of 1 to 20 carbon atoms include a methyl group, ethyl group, propyl group, butyl group, pentyl group, hexyl group, heptyl group, octyl group, nonyl group, decyl group, lauryl group and the like, and a pentyl group, hexyl group, octyl group and decyl group being preferable. Examples of the alkyl groups of 5 to 20 carbon atoms include pentyl group, hexyl group, heptyl group, octyl group, nonyl group, decyl group, lauryl group and the like, with pentyl group, hexyl group, octyl group and decyl group being preferred.

Examples of the aryl groups of 6 to 60 carbon atoms include a phenyl group, $C_1$ to $C_{12}$ alkoxyphenyl groups ($C_1$ to $C_{12}$ indicates 1 to 12 carbon atoms), $C_1$ to $C_{12}$ alkylphenyl groups, 1-naphthyl group, 2-naphthyl group and the like, with $C_1$ to $C_{12}$ alkoxyphenyl groups and $C_1$ to $C_{12}$ alkylphenyl groups being preferred.

Examples of the arylalkyl groups of 7 to 60 carbon atoms include phenyl-$C_1$ to $C_{12}$ alkyl groups, $C_1$ to $C_{12}$ alkoxyphenyl-$C_1$ to $C_{12}$ alkyl groups, $C_1$ to $C_{12}$ alkylphenyl-$C_1$ to $C_{12}$ alkyl groups, 1-naphthyl-$C_1$ to $C_{12}$ alkyl groups, 2-naphthyl-$C_1$ to $C_{12}$ alkyl groups and the like, with $C_1$ to $C_{12}$ alkoxyphenyl-$C_1$ to $C_{12}$ alkyl groups and $C_1$ to $C_{12}$ alkylphenyl-$C_1$ to $C_{12}$ alkyl groups being preferred. More specific examples thereof include a phenylmethyl group, phenylethyl group, phenylpropyl group, $C_1$ to $C_{12}$ alkoxyphenylmethyl group, $C_1$ to $C_{12}$ alkoxyphenylethyl group, $C_1$ to $C_{12}$ alkoxyphenylpropyl group, $C_1$ to $C_{12}$ alkylphenylmethyl group, $C_1$ to $C_{12}$ alkylphenylethyl group, $C_1$ to $C_{12}$ alkylphenylpropyl group, naphthylmethyl group, naphthylethyl group, naphthylpropyl group and the like, with $C_1$ to $C_{12}$ alkoxyphenylmethyl group, $C_1$ to $C_{12}$ alkoxyphenylethyl group, $C_1$ to $C_{12}$ alkoxyphenylpropyl group, $C_1$ to $C_{12}$ alkylphenylmethyl group, $C_1$ to $C_{12}$ alkylphenylethyl group and $C_1$ to $C_{12}$ alkylphenylpropyl group being preferred.

Examples of the heterocyclic compound groups of 4 to 60 carbon atoms include a thienyl group, $C_1$ to $C_{12}$ alkylthienyl groups, pyrrolyl group, furyl group, pyridyl group, $C_1$ to $C_{12}$ alkylpyridyl groups and the like, with a thienyl group, $C_1$ to $C_{12}$ alkylthienyl groups, pyridyl group and $C_1$ to $C_{12}$ alkylpyridyl groups being preferred.

Regarding substituents containing an alkyl group among examples of R, they may be any or linear, branched or cyclic or combination thereof, and when not linear, there are exemplified an isoamyl group, 2-ethylhexyl group, 3,7-dimethyloctyl group, cyclohexyl group, 4-$C_1$ to $C_{12}$ alkylcyclohexyl group and the like. For enhancing the solubility of a polymeric fluorescent substance into a solvent, it is preferable that a cyclic or branched alkyl chain is contained in one or more substituents of $Ar_1$ or $Ar_2$.

In the above-mentioned formula (1), n is 0 or 1, and in the above-mentioned formula (3), k is 0 or 1. $R_1$ and $R_2$ in the above-mentioned formula (1), $R_4$ and $R_5$ in the above-mentioned formula (2) and $R_6$ and $R_7$ in the above-mentioned formula (3), each independently, represent a hydrogen atom, an alkyl group having 1 to 20 carbon atoms, an aryl group having 6 to 60 carbon atoms, a heterocyclic compound group having 4 to 60 carbon atoms and cyano group.

When $R_1$, $R_2$, $R_4$, $R_5$, $R_6$, $R_7$ each represent a substituent other than a hydrogen atom or cyano group, examples of the alkyl group having 1 to 20 carbon atoms include a methyl group, ethyl group, propyl group, butyl group, pentyl group, hexyl group, heptyl group, octyl group, nonyl group, decyl group, lauryl group and the like, with methyl group, ethyl group, pentyl group, hexyl group, heptyl group and octyl group being preferred.

Examples of the aryl group having 6 to 60 carbon atoms include a phenyl group, $C_1$ to $C_{12}$ alkoxyphenyl group, $C_1$ to $C_{12}$ alkylphenyl group, 1-naphthyl group, 2-naphthyl group and the like, with a phenyl group and $C_1$ to $C_{12}$ alkylphenyl group being preferred.

Examples of the heterocyclic compound group having 4 to 60 carbon atoms include a thienyl group, $C_1$ to $C_{12}$ alkylthienyl group, pyrrolyl group, furyl group, pyridyl group, $C_1$ to $C_{12}$ alkylpyridyl group and the like, with a thienyl group, $C_1$ to $C_{12}$ alkylthienyl group, pyridyl group and $C_1$ to $C_{12}$ alkylpyridyl group being preferred.

Further, a protecting group may be used to stabilize the terminal group of a polymeric fluorescent substance in accordance with the present invention since if an active polymerizable group remains intact, there is a possibility of reduction of the light emitting property and life of the polymeric fluorescent substance when the material is used in a device.

Protecting groups having a conjugated bond continued to the conjugated structure of the main chain are preferable, and examples thereof include structures containing a bond to an aryl group or a heterocyclic compound group via a vinylene group. Specifically, protecting groups described in JP-A No. 9-45478, chemical formula 10, and the like are exemplified.

Any suitable method of synthesizing the polymeric fluorescent substance of the present invention may be used. A method described in JP-A No. 5-202355, may for example, be utilized when the main chain has a vinylene group. Namely, there may be utilized polymerization according to the Wittig reaction, such as polymerization of a dialdehyde compound with a diphosphonium salt compound. Further polymerization may be conducted by the Horner-Wadsworth-Emmons method of a dialdehyde compound with a diphosphate compound. Polymerization may also be conducted according to the Heck reaction of a divinyl compound with a dihalogen compound or of a vinyl halogen compound alone, or polycondensation may be conducted according to the de-hydrohalogenation method of a compound having two methyl halide groups. Polycondensation may also conducted according to the sulfonium salt decomposing method of a compound having two sulfonium salt groups. Polymerization may further be conducted according to the Knoevenagel reaction of a dialdehyde compound with a diacetonitrile compound. Of the foregoing, polymerization according to the Wittig reaction, polycondensation according to the de-hydrohalogenation method and polycondensation according to the sulfonium salt decomposing method are preferred.

Further, when the main chain has no vinylene group, examples of suitable methods for preparing the polymeric fluorescent substance of the present invention include a method of polymerization according to the Suzuki coupling reaction from the corresponding monomer, a method of polymerization using an oxidizer such as $FeCl_3$ and the like, a method of effecting oxidation polymerization electrochemically, a method using decomposition of an intermediate polymer having a suitable releasing group, and the like.

The above-mentioned polymeric fluorescent substance may contain repeating units other than the repeating units of the general formulae (1) and (3), in an amount which does not deteriorate the fluorescent property and charge transfer property. Further, the repeating units of the general formulae (1) and (3) and other repeating units may be connected by a non-conjugated unit having an ether group, an ester group, an amide group, an imide group or the like, or the repeating units may contain non-conjugated part thereof.

This polymeric fluorescent substance may also be a random, block or graft copolymer, or a polymer having an intermediate structure thereof, for example, a random copolymer having blocking property. From the viewpoint for obtaining a polymeric fluorescent substance having high fluorescent quantum yield, random copolymers having blocking property and block or graft copolymers are more preferable than complete random copolymers. Further, copolymers may have branched main chain and more than three terminals.

Further, as the polymeric fluorescent substance, those emitting fluorescence in a solid state are suitably used, since the material utilizes light emission from a thin film.

As good solvents for the polymeric fluorescent substance, there are exemplified chloroform, methylene chloride, dichloroethane, tetrahydrofuran, toluene, xylene, mesitylene, tetralin, decalin, n-butylbenzene and the like. The polymeric fluorescent substance can be usually dissolved in these solvents in an amount of 0.1 wt % or more, though the amount differs depending on the structure and molecular weight of the polymeric fluorescent substance.

The polymeric fluorescent substance has a number-average molecular weight of $5 \times 10^4$ to $1 \times 10^8$ in terms of polystyrene, and the degree of polymerization thereof also changes depending on repeating structures and proportion thereof. From the standpoint of film forming property, generally the total amount of repeating structures is preferably from 20 to 10000, more preferably from 30 to 10000, particularly preferably from 50 to 5000.

When these polymeric fluorescent substances are used as a light emitting material of a polymer LED, the purity thereof exerts an influence on light emitting property, therefore, it is preferable that a monomer before polymerization is purified by a method such as distillation, sublimation purification, re-crystallization and the like before being polymerized and further, it is preferable to conduct a purification treatment such as re-precipitation purification, chromatographic separation and the like after the synthesis.

Next, the polymer LED of the present invention will be illustrated. The polymer LED of the present invention is a polymer LED comprising a pair of electrodes composed of an anode and a cathode at least one of which is transparent or semitransparent and a light emitting layer disposed between the electrodes, and a polymeric fluorescent substance of the present invention is contained in the light emitting layer.

As the polymer LED of the present invention, there are listed polymer LEDs having an electron transporting layer disposed between a cathode and a light emitting layer, polymer LEDs having a hole transporting layer disposed between an anode and a light emitting layer, polymer LEDs having an electron transporting layer disposed between a cathode and a light emitting layer and having a hole transporting layer disposed between an anode and a light emitting layer.

For example, the following structures a) to d) are specifically exemplified.

a) anode/light emitting layer/cathode
b) anode/hole transporting layer/light emitting layer/cathode
c) anode/light emitting layer/electron transporting layer/cathode
d) anode/hole transporting layer/light emitting layer/electron transporting layer/cathode (wherein, /indicates adjacent lamination of layers. Hereinafter, the same)

Herein, the light emitting layer is a layer having function to emit a light, the hole transporting layer is a layer having function to transport a hole, and the electron transporting layer is a layer having function to transport an electron. Herein, the electron transporting layer and the hole transporting layer are generically called a charge transporting layer.

The light emitting layer, hole transporting layer and electron transporting layer may also each independently used in two or more layers.

Of charge transporting layers disposed adjacent to an electrode, that having function to improve charge injecting efficiency from the electrode and having effect to decrease driving voltage of an device are particularly called sometimes a charge injecting layer (hole injecting layer, electron injecting layer) in general.

For enhancing adherence with an electrode and improving charge injection from an electrode, the above-described charge injecting layer or insulation layer having a thickness of 2 nm or less may also be provided adjacent to an electrode, and further, for enhancing adherence of the interface, preventing mixing and the like, a thin buffer layer may also be inserted into the interface of a charge transporting layer and light emitting layer.

The order and number of layers laminated and the thickness of each layer can be appropriately applied while considering light emitting efficiency and life of the device.

In the present invention, as the polymer LED having a charge injecting layer (electron injecting layer, hole injecting layer) provided, there are listed a polymer LED having a charge injecting layer provided adjacent to a cathode and a polymer LED having a charge injecting layer provided adjacent to an anode.

For example, the following structures e) to p) are specifically exemplified.

e) anode/charge injecting layer/light emitting layer/cathode
f) anode/light emitting layer/charge injecting layer/cathode
g) anode/charge injecting layer/light emitting layer/charge injecting layer/cathode
h) anode/charge injecting layer/hole transporting layer/light emitting layer/cathode
i) anode/hole transporting layer/light emitting layer/charge injecting layer/cathode
j) anode/charge injecting layer/hole transporting layer/light emitting layer/charge injecting layer/cathode
k) anode/charge injecting layer/light emitting layer/electron transporting layer/cathode
l) anode/light emitting layer/electron transporting layer/charge injecting layer/cathode
m) anode/charge injecting layer/light emitting layer/electron transporting layer/charge injecting layer/cathode
n) anode/charge injecting layer/hole transporting layer/light emitting layer/electron transporting layer/cathode
o) anode/hole transporting layer/light emitting layer/electron transporting layer/charge injecting layer/cathode
p) anode/charge injecting layer/hole transporting layer/light emitting layer/electron transporting layer/charge injecting layer/cathode As the specific examples of the charge injecting layer, there are exemplified layers containing an conducting polymer, layers which are disposed between an anode and a hole transporting layer and contain a material having an ionization potential between the ionization potential of an anode material and the ionization potential of a hole transporting material contained in the hole transporting layer, layers which are disposed between a cathode and an electron transporting layer and contain a material having an electron affinity between the electron affinity of a cathode material and the electron affinity of an electron transporting material contained in the electron transporting layer, and the like.

When the above-described charge injecting layer is a layer containing an conducting polymer, the electric conductivity of the conducting polymer is preferably $10^{-5}$ S/cm or more and $10^3$ S/cm or less, and for decreasing the leak current between light emitting pixels, more preferably $10^{-5}$ S/cm or more and $10^2$ S/cm or less, further preferably $10^{-5}$ S/cm or more and $10^1$ S/cm or less.

Usually, to provide an electric conductivity of the conducting polymer of $10^{-5}$ S/cm or more and $10^3$ S/cm or less, a suitable amount of ions are doped into the conducting polymer.

Regarding the kind of an ion doped, an anion is used in a hole injecting layer and a cation is used in an electron injecting layer. As examples of the anion, a polystyrene sulfonate ion, alkylbenzene sulfonate ion, camphor sulfonate ion and the like are exemplified, and as examples of the cation, a lithium ion, sodium ion, potassium ion, tetrabutyl ammonium ion and the like are exemplified.

The thickness of the charge injecting layer is for example, from 1 nm to 100 nm, preferably from 2 nm to 50 nm.

Materials used in the charge injecting layer may properly be selected in view of relation with the materials of electrode and adjacent layers, and there are exemplified conducting polymers such as polyaniline and derivatives thereof, polythiophene and derivatives thereof, polypyrrole and derivatives thereof, poly(phenylene vinylene) and derivatives thereof, poly(thienylene vinylene) and derivatives thereof, polyquinoline and derivatives thereof, polyquinoxaline and derivatives thereof, polymers containing aromatic amine structures in the main chain or the side chain, and the like, and metal phthalocyanine (copper phthalocyanine and the like), carbon and the like.

The insulation layer having a thickness of 2 nm or less has function to make charge injection easy. As the material of the above-described insulation layer, metal fluoride, metal oxide, organic insulation materials and the like are listed. As the polymer LED having an insulation layer having a thickness of 2 nm or less, there are listed polymer LEDs having an insulation layer having a thickness of 2 nm or less provided adjacent to a cathode, and polymer LEDs having an insulation layer having a thickness of 2 nm or less provided adjacent to an anode.

Specifically, there are listed the following structures q) to ab) for example.

q) anode/insulation layer having a thickness of 2 nm or less/light emitting layer/cathode
r) anode/light emitting layer/insulation layer having a thickness of 2 nm or less/cathode
s) anode/insulation layer having a thickness of 2 nm or less/light emitting layer/insulation layer having a thickness of 2 nm or less/cathode
t) anode/insulation layer having a thickness of 2 nm or less/hole transporting layer/light emitting layer/cathode
u) anode/hole transporting layer/light emitting layer/insulation layer having a thickness of 2 nm or less/cathode
v) anode/insulation layer having a thickness of 2 nm or less/hole transporting layer/light emitting layer/insulation layer having a thickness of 2 nm or less/cathode
w) anode/insulation layer having a thickness of 2 nm or less/light emitting layer/electron transporting layer/cathode
x) anode/light emitting layer/electron transporting layer/insulation layer having a thickness of 2 nm or less/cathode
y) anode/insulation layer having a thickness of 2 nm or less/light emitting layer/electron transporting layer/insulation layer having a thickness of 2 nm or less/cathode
z) anode/insulation layer having a thickness of 2 nm or less/hole transporting layer/light emitting layer/electron transporting layer/cathode
aa) anode/hole transporting layer/light emitting layer/electron transporting layer/insulation layer having a thickness of 2 nm or less/cathode
ab) anode/insulation layer having a thickness of 2 nm or less/hole transporting layer/light emitting layer/electron transporting layer/insulation layer having a thickness of 2 nm or less/cathode In producing a polymer LED, when a film is formed from a solution by using such polymeric fluorescent substance soluble in an organic solvent, only required is removal of the solvent by drying after coating of this solution, and even in the case of mixing of a charge transporting material and a light emitting material, the same method can be applied, causing an extreme advantage in production. As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

Regarding the thickness of the light emitting layer, the optimum value differs depending on material used, and may properly be selected so that the driving voltage and the light emitting efficiency become optimum values, and for example, it is from 1 nm to 1 $\mu$m, preferably from 2 nm to 500 nm, further preferably from 5 nm to 200 nm.

In the polymer LED of the present invention, light emitting materials other than the above-described polymeric fluorescent substance can also be mixed in a light emitting layer. Further, in the polymer LED of the present invention, the light emitting layer containing light emitting materials other than the above-described polymeric fluorescent substance may also be laminated with a light emitting layer containing the above-described polymeric fluorescent substance.

As the light emitting material, known materials can be used. In a compound having lower molecular weight, there can be used, for example, naphthalene derivatives, anthracene or derivatives thereof, perylene or derivatives thereof; dyes such as polymethine dyes, xanthene dyes, coumarine dyes, cyanine dyes; metal complexes of 8-hydroxyquinoline or derivatives thereof, aromatic amine, tetraphenylcyclopentane or derivatives thereof, or tetraphenylbutadiene or derivatives thereof, and the like.

Specifically, there can be used known compounds such as those described in JP-A Nos. 57-51781, 59-195393 and the like, for example.

When the polymer LED of the present invention has a hole transporting layer, as the hole transporting materials used, there are exemplified polyvinylcarbazole or derivatives thereof, polysilane or derivatives thereof polysiloxane derivatives having an aromatic amine in the side chain or the main chain, pyrazoline derivatives, arylamine derivatives, stilbene derivatives, triphenyldiamine derivatives, polyaniline or derivatives thereof, polythiophene or derivatives thereof, polypyrrole or derivatives thereof, poly(p-phenylenevinylene) or derivatives thereof, poly(2,5-thienylenevinylene) or derivatives thereof, or the like.

Specific examples of the hole transporting material include those described in JP-A Nos. 63-70257, 63-175860, 2-135359, 2-135361, 2-209988, 3-37992 and 3-152184.

Among them, as the hole transporting materials used in the hole transporting layer, preferable are polymer hole transporting materials such as polyvinylcarbazole or derivatives thereof, polysilane or derivatives thereof, polysiloxane derivatives having an aromatic amine compound group in the side chain or the main chain, polyaniline or derivatives thereof, polythiophene or derivatives thereof, poly(p-phenylenevinylene) or derivatives thereof, poly(2,5-thienylenevinylene) or derivatives thereof, or the like, and further preferable are polyvinylcarbazole or derivatives thereof, polysilane or derivatives thereof and polysiloxane derivatives having an aromatic amine compound group in the side chain or the main chain. In the case of a hole transporting material having lower molecular weight, it is preferably dispersed in a polymer binder for use.

Polyvinylcarbazole or derivatives thereof are obtained, for example, by cation polymerization or radical polymerization from a vinyl monomer.

As the polysilane or derivatives thereof, there are exemplified compounds described in Chem. Rev. 89, 1359 (1989) and GB 2300196 published specification, and the like. For synthesis, methods described in them can be used, and a Kipping method can be suitably used particularly.

As the polysiloxane or derivatives thereof, those having the structure of the above-described hole transporting material having lower molecular weight in the side chain or main chain, since the siloxane skeleton structure has poor hole transporting property. Particularly, there are exemplified those having an aromatic amine having hole transporting property in the side chain or main chain.

The method for forming a hole transporting layer is not restricted, and in the case of a hole transporting layer having lower molecular weight, a method in which the layer is formed from a mixed solution with a polymer binder is exemplified. In the case of a polymer hole transporting material, a method in which the layer is formed from a solution is exemplified.

The solvent used for the film forming from a solution is not particularly restricted providing it can dissolve a hole transporting material. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like, from a solution.

The polymer binder mixed is preferably that does not disturb charge transport extremely, and that does not have strong absorption of a visible light is suitably used. As such polymer binder, polycarbonate, polyacrylate, poly(methyl acrylate), poly(methyl methacrylate), polystyrene, poly(vinyl chloride), polysiloxane and the like are exemplified.

Regarding the thickness of the hole transporting layer, the optimum value differs depending on material used, and may properly be selected so that the driving voltage and the light emitting efficiency become optimum values, and at least a thickness at which no pin hole is produced is necessary, and too large thickness is not preferable since the driving voltage of the device increases. Therefore, the thickness of the hole transporting layer is, for example, from 1 nm to 1 μm, preferably from 2 nm to 500 nm, further preferably from 5 nm to 200 nm.

When the polymer LED of the present invention has an electron transporting layer, known compounds are used as the electron transporting materials, and there are exemplified oxadiazole derivatives, anthraquinonedimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, or metal complexes of 8-hydroxyquinoline or derivatives thereof, polyquinoline and derivatives thereof, polyquinoxaline and derivatives thereof, polyfluorene or derivatives thereof, and the like.

Specifically, there are exemplified those described in JP-A Nos. 63-70257, 63-175860, 2-135359, 2-135361, 2-209988, 3-37992 and 3-152184.

Among them, oxadiazole derivatives, benzoquinone or derivatives thereof, anthraquinone or derivatives thereof, or metal complexes of 8-hydroxyquinoline or derivatives thereof, polyquinoline and derivatives thereof, polyquinoxaline and derivatives thereof, polyfluorene or derivatives thereof are preferable, and 2-(4-biphenyl)-5-(4-t-butylphenyl)-1,3,4-oxadiazole, benzoquinone, anthraquinone, tris(8-quinolinol)aluminum and polyquinoline are further preferable.

The method for forming the electron transporting layer is not particularly restricted, and in the case of an electron transporting material having lower molecular weight, a vapor deposition method from a powder, or a method of film-forming from a solution or melted state is exemplified, and in the case of a polymer electron transporting material, a method of film-forming from a solution or melted state is exemplified, respectively.

The solvent used in the film-forming from a solution is not particularly restricted provided it can dissolve electron transporting materials and/or polymer binders. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film-forming method from a solution or melted state, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

The polymer binder to be mixed is preferably that which does not extremely disturb a charge transport property, and that does not have strong absorption of a visible light is suitably used. As such polymer binder, poly(N-vinylcarbazole), polyaniline or derivatives thereof, polythiophene or derivatives thereof, poly(p-phenylene vinylene) or derivatives thereof, poly(2,5-thienylene vinylene) or derivatives thereof, polycarbonate, polyacrylate, poly(methyl acrylate), poly(methyl methacrylate), polystyrene, poly(vinyl chloride), polysiloxane and the like are exemplified.

Regarding the thickness of the electron transporting layer, the optimum value differs depending on material used, and may properly be selected so that the driving voltage and the light emitting efficiency become optimum values, and at least a thickness at which no pin hole is produced is necessary, and too large thickness is not preferable since the driving voltage of the device increases. Therefore, the thickness of the electron transporting layer is, for example, from 1 nm to 1 μm, preferably from 2 nm to 500 nm, further preferably from 5 nm to 200 nm.

The substrate forming the polymer LED of the present invention may preferably be that does not change in forming an electrode and layers of organic materials, and there are exemplified glass, plastics, polymer film, silicon substrates and the like. In the case of a opaque substrate, it is preferable that the opposite electrode is transparent or semitransparent.

In the present invention, it is preferable that an anode is transparent or semitransparent, and as the material of this anode, electron conductive metal oxide films, semitransparent metal thin films and the like are used. Specifically, there are used indium oxide, zinc oxide, tin oxide, and films (NESA and the like) fabricated by using an electron conductive glass composed of indium. tin.oxide (ITO), indium.zinc.oxide and the like, which are metal oxide complexes, and gold, platinum, silver, copper and the like are used, and among them, ITO, indium. zinc.oxide, tin oxide are preferable. As the fabricating method, a vacuum vapor deposition method, sputtering method, ion plating method, plating method and the like are used. As the anode, there may also be used organic transparent conducting films such as polyaniline or derivatives thereof, polythiophene or derivatives thereof and the like.

The thickness of the anode can be appropriately selected while considering transmission of a light and electric conductivity, and for example, from 10 nm to 10 µm, preferably from 20 nm to 1 µm, further preferably from 50 nm to 500 nm.

Further, for easy charge injection, there may be provided on the anode a layer comprising a phthalocyanine derivative conducting polymers, carbon and the like, or a layer having an average film thickness of 2 nm or less comprising a metal oxide, metal fluoride, organic insulating material and the like.

As the material of a cathode used in the polymer LED of the present invention, that having lower work function is preferable. For example, there are used metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, or alloys comprising two of more of them, or alloys comprising one or more of them with one or more of gold, silver, platinum, copper, manganese, titanium, cobalt, nickel, tungsten and tin, graphite or graphite intercalation compounds and the like. Examples of alloys include a magnesium-silver alloy, magnesium-indium alloy, magnesium-aluminum alloy, indium-silver alloy, lithium-aluminum alloy, lithium-magnesium alloy, lithium-indium alloy, calcium-aluminum alloy and the like. The cathode may be formed into a laminated structure of two or more layers.

The thickness of the cathode can be appropriately selected while considering transmission of a light and electric conductivity, and for example, from 10 nm to 10 µm, preferably from 20 nm to 1 µm, further preferably from 50 nm to 500 nm.

As the method for fabricating a cathode, there are used a vacuum vapor deposition method, sputtering method, lamination method in which a metal thin film is adhered under heat and pressure, and the like. Further, there may also be provided, between a cathode and an organic layer, a layer comprising an conducting polymer, or a layer having an average film thickness of 2 nm or less comprising a metal oxide, metal fluoride, organic insulation material and the like, and after fabrication of the cathode, a protective layer may also be provided which protects the polymer LED. For stable use of the polymer LED for a long period of time, it is preferable to provide a protective layer and/or protective cover for protection of the device in order to prevent it from outside damage.

As the protective layer, there can be used a polymer compound, metal oxide, metal fluoride, metal borate and the like. As the protective cover, there can be used a glass plate, a plastic plate the surface of which has been subjected to lower-water-permeation treatment, and the like, and there is suitably used a method in which the cover is pasted with an device substrate by a thermosetting resin or light-curing resin for sealing. If space is maintained using a spacer, it is easy to prevent an device from being injured. If an inner gas such as nitrogen and argon is sealed in this space, it is possible to prevent oxidation of a cathode, and further, by placing a desiccant such as barium oxide and the like in the above-described space, it is easy to suppress the damage of an device by moisture adhered in the production process. Among them, any one means or more are preferably adopted.

For obtaining light emission in plane form using the polymer LED of the present invention, an anode and a cathode in the plane form may properly be placed so that they are laminated each other. Further, for obtaining light emission in pattern form, there are a method in which a mask with a window in pattern form is placed on the above-described plane light emitting device, a method in which an organic layer in non-light emission part is formed to obtain extremely large thickness providing substantial non-light emission, and a method in which any one of an anode or a cathode, or both of them are formed in the pattern. By forming a pattern by any of these methods and by placing some electrodes so that independent on/off is possible, there is obtained a display device of segment type which can display digits, letters, simple marks and the like. Further, for forming a dot matrix device, it may be advantageous that anodes and cathodes are made in the form of stripes and placed so that they cross at right angles. By a method in which a plurality of kinds of polymeric fluorescent substances emitting different colors of lights are placed separately or a method in which a color filter or luminescence converting filter is used, area color displays and multi color displays are obtained. A dot matrix display can be driven by passive driving, or by active driving combined with TFT and the like. These display devices can be used as a display of a computer, television, portable terminal, portable telephone, car navigation, view finder of a video camera, and the like.

Further, the above-described light emitting device in plane form is a thin self-light-emitting one, and can be suitably used as a flat light source for back-light of a liquid crystal display, or as a flat light source for illumination. Further, if a flexible plate is used, it can also be used as a curved light source or a display.

EXAMPLES

The following examples further illustrate the present invention in detail but do not limit the scope thereof.

Herein, regarding the number average molecular weight, a polystyrene reduced number-average molecular weight was measured by gel permeation chromatography (GPC) using chloroform as a solvent.

Example 1

<Synthesis of 1-(3,7-dimethyloctyloxy)-2,5-dimethylbenzene>

Into a 500 ml four-necked flask was placed 36.7 g (0.3 mol) of 2,5-dimethylphenol, then, 73.0 g (0.33 mol) of 3,7-dimethyloctyl bromide was added, further, 150 g of water and 2.0 g (6.2 mmol) of tetrabutylammonium bromide were charged into the flask, and sufficient nitrogen purge was conducted by bubbling nitrogen through the mixture while stirring. Into this mixed solution was added an aqueous solution of sodium hydroxide (a solution prepared by dissolving 14.4 g (0.36 mol) of sodium hydroxide in 22 g of water) dropwise over 10 minutes while stirring. The mixture was heated to 95° C. and reacted for 30 minutes. Then, the mixture was kept at 100° C. and stirred for 4 hours to complete the reaction. The mixture was cooled to room temperature, and 200 ml of toluene was added before liquid separation. The intended substance was extracted into the organic layer which was washed with 200 ml of a 5% sodium hydroxide aqueous solution. The organic layer was dried over sodium sulfate, then, the solvent was distilled off by an evaporator. The intended 1-(3,7-dimethyloctyloxy)-2, 5-dimethylbenzene was obtained from the condensed solution by distillation isolation (101 to 108° C./0.01 mmHg). The yield amount was 54.8 g (0.21 mol) and the yield was 70%.

<Synthesis of 1-(3,7-dimethyloctyloxy)-2,5-dimethyl-4-bromobenzene>

Into a 300 ml four-necked flask was placed 31.68 g (0.12 mol) of 1-(3,7-dimethyloctyloxy)-2,5-dimethylbenzene and 10 ml of chloroform and 0.21 g (0.8 mmol) of iodine, and the flask was purged with nitrogen while stirring and the mixture was cooled to 0° C. Bromine in an amount of 19.18 g (0.12 mol) was added dropwise over 1 hour while keeping the temperature not more than 5° C. After addition, the mixture was heated to 30° C. and kept at the same temperature for 5 hours to complete the reaction. The mixture was cooled to room temperature, and the reaction mixture was added into 200 ml of a 5% sodium hydroxide aqueous solution. The mixture was stirred for 10 minutes, then, separated and extracted. The chloroform layer was washed with 200 ml of water, and the organic layer was dried over sodium sulfate. It was concentrated by an evaporator and the resulting residue was purified by column chromatography to obtain 1-(3,7-dimethyloctyloxy)-2,5-dimethyl-4-bromobenzene. The yield amount was 30 g (87.9 mmol) and the yield was 73%.

<Synthesis of 2,5-dimethyl-4-(3,7-dimethyloctyloxy)-biphenyl>

Into a 300 ml four-necked flask was placed 57 g of toluene, 57 g of water, 16.9 g (0.122 mol) of potassium carbonate and 20.48 g (60 mmol) of 1-(3,7-dimethyloctyloxy)-2,5-dimethyl-4-bromobenzene, and an argon gas was bubbled through the mixture while stirring. Phenylboric acid in an amount of 8.05 g (66 mmol) was added and the mixture was stirred for 10 minutes, and 0.28 g (0.24 mmol) of palladium tetrakistriphenylphosphine complex was added. The mixture was heated up to 90° C. and the mixture was maintained at 90 to 95° C. for 5 hours to complete the reaction. The mixture was cooled to room temperature, separated, and the organic layer was washed with 100 g of water, then, dried over sodium sulfate. Toluene was distilled off by an evaporator, and 2,5-dimethyl-4-(3,7-diethyloctyloxy)-biphenyl was isolated from the concentrated residue by column chromatography. The yield amount was 9.0 g (26.6 mmol) and the yield was 44%.

<Synthesis of 2,5-bis(bromomethyl)-4-(3,7-dimethyloctyloxy)-biphenyl>

Into a 200 ml four-necked flask was placed 4.4 g (13 mmol) of 2,5-dimethyl-4-(3,7-dimethyloctyloxy)-biphenyl and 88 g of carbon tetrachloride. Argon was bubble through the mixture while stirring, and the mixture was heated up to 60° C. The mixture was stirred for 5 minutes after heating to 60° C., 0.22 g (1.34 mmol) of azobisisobutyronitrile. N-bromosuccinic imide in an amount of 5.55 g (28.6 mmol) of was added portionwise over 30 minutes. After completion of addition, the mixture was maintained at 65° C. for 2 hours and reacted while stirring. The mixture was cooled to 50° C. and the deposited solid was filtrated. The solid was washed with 100 g of carbon tetrachloride. This filtrate was concentrated, and carbon tetrachloride was distilled off by an evaporator. From the residue, the intended substance, 2,5-bis(bromomethyl)-4-(3,7-dimethyloxyloxy)-biphenyl was purified and isolated using column chromatography. The yield amount was 1.8 g (3.63 mmol) and the yield was 28%.

<Synthesis of Polymeric fluorescent substance 1>

Into a 200 ml four-necked flask was placed 47.6 g of dioxane, and the mixture was heated up to 90° C. while conducting argon bubbling. To this was added a solution prepared by dissolving 13 mg (0.026 mmol) of 2,5-bis(bromomethyl)-4-(3,7-dimethyloctyloxy)-biphenyl and 256 mg (0.626 mmol) of 2,5-bis(chloromethyl)-4'-(3,7-dimethyloctyloxy)-biphenyl in 3 g of dioxane. The mixture was stirred for 5 minutes, then, a solution prepared by dissolving 7 g of dioxane in 330 mg (2.94 mmol) of potassium-t-butoxide was added dropwise over 10 minutes. The mixture was stirred for 2 hours while maintaining the temperature at 90 to 95° C. After the mixture was cooled to 50° C., then, a mixed solution of 267 mg (4.45 mmol) of acetic acid and 280 mg of dioxane was dropped for neutralization. The mixture was stirred for 10 minutes, the mixture was cooled to 30° C. Water in an amount of 200 ml was placed in a separate beaker, and the reaction mixture was added to this while stirring. The mixture was stirred for 30 minutes, and the deposited solid was filtrated and washed with 200 ml of methanol. The solid on the filter was dried under reduced pressure.

200 ml of tetrahydrofuran (50 g) was placed in a 300 ml four-necked flask. Argon gas was bubbled through the flask while stirring. The vacuum-dried solid was added to this and the mixture was heated to 65° C., and the mixture was stirred for 1 hour. The mixture was cooled to 30° C., and the tetrahydrofuran solution was added dropwise into a separately prepared methanol (100 ml) solvent while stirring. The mixture solution containing the deposited polymer was stirred for 30 minutes, then, filtrated and the resulting solid was washed with methanol (100 g), and removed before drying under reduced pressure. 120 mg of a polymer was obtained. The resulting polymer is a copolymer of 2-(3,7-dimethyloctyloxy)-5-phenyl-1,4-phenylenevinylene with 4'-(3,7-dimethyloctyloxy)-phenyl-1,4-phenylenevinylene, and contains about 4 mol % of 2-(3,7-dimethyloctyloxy)-5-phenyl-1,4-phenylenevinylene.

Comparative Example 1

<Synthesis of Polymeric Fluorescent Substance 2>

Into a 200 ml four-necked flask was placed 47.6 g of dioxane, and the mixture was heated up to 90° C. while conducting argon bubbling. To this was added a solution prepared by dissolving 160 mg (0.320 mmol) of 2,5-bis(bromomethyl)-4-(3,7-dimethyloctyloxy)-biphenyl and 131 mg (0.320 mmol) of 2,5-bis(chloromethyl)-4'-(3,7-dimethyloctyloxy)-biphenyl in 3 g of dioxane. The mixture was stirred for 5 minutes, then, a solution prepared by dissolving 7 g of dioxane in 330 mg (2.94 mmol) of potassium-t-butoxide was added dropwise over 10 minutes. The mixture was stirred for 2 hours while maintaining the temperature at 90 to 95° C. After the mixture was cooled to 50° C., then, a mixed solution of 267 mg (4.45 mmol) of acetic acid and 280 mg of dioxane was dropped for neutralization. The mixture was stirred for 10 minutes, the mixture was cooled to 30° C. Water in an amount of 200 ml was placed in a separate beaker, and the reaction mixture was added to this while stirring. The mixture was stirred for 30 minutes, and the deposited solid was filtrated and washed with 200 ml of methanol. The solid on the filter was dried under reduced pressure.

Tetrahydrofuran in an amount of 200 ml (50 g) was placed in a 300 ml four-necked flask. An argon gas was bubbled through while stirring. The vacuum-dried solid was added to this and the mixture was heated to 65° C., and the mixture was stirred for 1 hour. The mixture was cooled to 30° C., and the tetrahydrofuran solution was added dropwise into a separately prepared methanol (100 ml) solvent while stirring. The mixture solution containing the deposited polymer was stirred for 30 minutes, then, filtrated and the resulting solid was washed with methanol (100 g), and removed before drying under reduced pressure. 115 mg of a polymer was obtained. The resulted polymer is a copolymer of 2-(3,7-dimethyloctyloxy)-5-phenyl-1,4-phenylenevinylene with 4'-(3,7-dimethyloctyloxy)-phenyl-1,4-phenylenevinylene, and contains about 50% of 2-(3,7-dimethyloctyloxy)-5-phenyl-1,4-phenylenevinylene.

Example 2
<Synthesis of Polymeric Fluorescent Substance 3>

Into a 200 ml four-necked flask was placed 47.6 g of dioxane, and the mixture was heated up to 90° C. while conducting argon bubbling. To this was added a solution prepared by dissolving 25.6 mg (0.051 mmol) of 2,5-bis (bromomethyl)-4-(3,7-dimethyloctyloxy)-biphenyl, 121 mg (0.294 mmol) of 2,5-bis(chloromethyl)-4'-(3,7-dimethyloctyloxy)-biphenyl and 123 mg (0.294 mmol) of 2-methyl-5-(3,7-dimethyloctyloxy)-p-xylylenedibromide in 3 g of dioxane. The mixture was stirred for 5 minutes, then, a solution prepared by dissolving 7 g of dioxane in 330 mg (2.94 mmol) of potassium-t-butoxide was added dropwise over 10 minutes. The mixture was stirred for 2 hours while keeping the temperature at 90 to 95° C. After the mixture was cooled to 50° C., then, a mixed solution of 267 mg (4.45 mmol) of acetic acid and 280 mg of dioxane was dropped for neutralization. The mixture was stirred for 10 minutes, the mixture was cooled to 30° C. Water in an amount of 200 ml was placed in a separate beaker, and the reaction mixture was added to this while stirring. The mixture was stirred for 30 minutes, and the deposited solid was filtrated and washed with 200 ml of methanol. The solid on the filter was dried under reduced pressure.

Tetrahydrofuran in an amount of 200 ml (50 g) was placed in a 300 ml four-necked flask. Argon gas was bubbled through while stirring. The vacuum-dried solid was added to this and the mixture was heated to 65° C., and the mixture was stirred for 1 hour. The mixture was cooled to 30° C., and the tetrahydrofuran solution was added dropwise into a separately prepared methanol (100 ml) solvent while stirring. The mixture solution containing the deposited polymer was stirred for 30 minutes, then, filtrated and the resulting solid was washed with methanol (100 g), and removed before drying under reduced pressure. 124 mg of a polymer was obtained. The resulted polymer is a copolymer of 2-(3,7-dimethyloctyloxy)-5-phenyl-1,4-phenylenevinylene with 4'-(3,7-dimethyloctyloxy)-phenyl-1,4-phenylenevinylene, and contains about 8% of 2-(3,7-dimethyloctyloxy)-5-phenyl-1,4-phenylenevinylene.

<Measurement of Absorption Spectrum, and Fluorescent Spectrum>

The polymeric fluorescent substances 1 to 3 were dissolved in chloroform. A 0.1% chloroform solution of each substance was spin-coated on a quartz plate to obtain a thin film of each polymer. The absorption spectrum, and fluorescent spectrum of the thin films were measured using respectively an automatic recording spectrophotometer UV365 (manufactured by Shimadzu. Corp.) and a fluorescent spectrophotometer 850 (manufactured by Hitachi. Corp.). For each polymeric fluorescent substance, regarding the fluorescent spectrum when excited at 410 nm, wave numbers were plotted on an abscissa and the area was calculated, and the resulting value was divided by the absorption at 410 nm to obtain the fluorescent intensity (relative value). As shown in Table 1, the polymeric fluorescent substances 1 and 3 of the present invention exhibited stronger fluorescence than comparative polymeric fluorescent substance 2.

TABLE 1

|  |  | Fluorescence peak | Fluorescence intensity | Light emitting efficiency |
| --- | --- | --- | --- | --- |
| Example 1 | Polymeric fluorescent substance 1 | 526 (Green) | 1.6 | 4.4 |
| Comparative example 1 | Polymeric fluorescent substance 2 | 546 (Yellow) | 0.8 | 2.2 |
| Example 2 | Polymeric fluorescent substance 3 | 532 (Green) | 1.6 | — |

REFERENCE EXAMPLE 1

According to the same polymerization method as in Example 3, 2,5-bis(bromomethyl)-4-(3,7-dimethyloctyloxy)-biphenyl, 2,5-bis(chloromethyl)-4'-(3,7-dimethyloctyloxy)-biphenyl and 2-methyl-5-(3,7-dimethyloctyloxy)-p-xylylenedibromide were each polymerized alone to obtain three kinds of polymers.

The absorption edge wavelengths of Polymeric fluorescent substance 4 [poly (2-(3,7-dimethyloctyloxy)-5-phenyl-1,4-phenylenevinylene)], Polymeric fluorescent substance 5 [poly (5-(4'-(3,7-dimethyloctyloxy)phenyl)-1,4-phenylenevinylene)] and Polymeric fluorescent substance 6 [poly (2-methyl-5-(3,7-dimethyloctyloxy)-1,4-phenylenevinylene)] were 540 nm, 510 nm and 525 nm, respectively. Namely, $\lambda_1$=540 nm, $\lambda_2$=510 nm or 525 nm, therefore, any case satisfies the following formula:

$$1239/\lambda_2 \geq 1239/\lambda_1 + 0.050.$$

Example 4
<Production and Evaluation of Device>

On a glass substrate having an ITO film sputtered thereon in a thickness of 150 nm, a 0.4 wt % chloroform solution of Polymeric fluorescent substance 1 was spin-coated to form a film having a thickness of 100 nm. Further, this was dried under reduced pressure at 80° C. for 1 hour, then, 25 nm of calcium and 40 nm of aluminum were vapor-deposited as cathodes to provide a polymer LED. The degree of vacuum in any case was 1 to $8\times10^{-6}$ Torr. Voltage was applied on the resulting device to obtain EL light emission from Polymeric fluorescent substance 1. The light emitting efficiency was 4.4 cd/A.

Example 5
<Synthesis of Polymeric Fluorescent Substance 7>

0.82 g (1.495 mmol) of 9,9-dioctyl-2,7-dibromofluorene and 27.4 g (0.0622 mmol) of 2-(2-ethylhexyloxy)-5-phenyl-1,4-dibromobenzene and 0.55 g of 2,2'-bipyridyl were charged into a reaction vessel, then, and the reaction system was purged with argon. To this was added 40 ml of toluene which had previously been deaerated by argon bubbling. Then, to this mixed solution was added 0.96 g of bis(1,5-cyclooctadiene) nickel (0), and the mixture was stirred for 10 minutes, then, reacted for 7 hours at 60° C. The reaction was conducted in an argon atmosphere. After the reaction, the solution was cooled, then, poured into a 25% ammonia water (10 ml)/methanol (150 ml)/ion exchange water (50 ml) mixed solution and the mixture was stirred for about 1 hour. Then, the mixed solution was allowed to stand still to cause separation into two layers, and the upper later was recovered. The solution was poured into methanol, re-precipitated, and the produced precipitation was recovered. The precipitate was dried, then, dissolved in chloroform. This solution was filtrated, and insoluble substances were removed, then, the solution was poured into methanol, to cause re-precipitation, and the resulting precipitate was recovered. The resulting precipitate was dried under reduced pressure, to obtain a polymer. The resulted polymer was a copolymer of 2-(2-ethylhexyloxy)-5-phenyl-1,4-phenylene with 9.9-dioctyl-2,7-fluorene-diyl, and contained about 4 mol % of 2-(2-ethylhexyloxy)-5-phenyl-1,4-phenylene.

EFFECT OF THE INVENTION

The polymeric fluorescent substance of the present invention is composed of a copolymer containing an arylene or arylenevinylene having an aryl group or heterocyclic compound group or substituent on an arylene group constituting the main chain, exhibits stronger fluorescence, and can be used suitably as a polymer LED and pigment for laser. Further, a polymer LED using the polymeric fluorescent substance of the present invention exhibits low voltage and high efficiency. Therefore, this polymer LED can be used in apparatuses such as a curved or sheet-formed light source as a back light, display device of segment type, flat panel display of dot matrix type, and the like.

What is claimed is:

1. A polymeric fluorescent substance exhibiting fluorescence in solid state, having a polystyrene reduced number-average molecular weight of $5\times10^4$ to $1\times10^8$, and containing one or more repeating units of the following general formula (1) and one or more repeating units of formula (3), the total amount of the repeating units being 50 mol % or more based on the total amount of all repeating units, and the total amount of repeating units of formula (1) being from 0.1 mol % to 15 mol % based on the total amount of all repeating units of formulae (1) and (3):

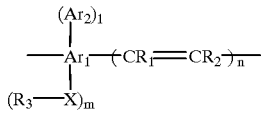 (1)

wherein, $Ar_1$ represents an arylene group having 6 to 60 carbon atoms contained in the main chain part or a divalent heterocyclic group having 4 or more and 60 or less carbon atoms contained in the main chain part thereof, $Ar_2$ represents an aryl group having 6 to 60 carbon atoms or a heterocyclic group having 4 to 60 carbon atoms, l represents an integer from 1 to 4, and m represents an integer from 1 to 4, provided l+m does not exceed the maximum possible number of substituents on $Ar_1$, X represents an oxygen atom, sulfur atom or a group of formula (2), $R_3$ is selected from the group consisting of an alkyl group having 1 to 20 carbon atoms, an aryl groups having 6 to 60 carbon atoms, an arylalkyl group having 7 to 60 carbon atoms and a heterocyclic group having 4 to 60 carbon atoms, each of $R_1$ and $R_2$ independently is selected from the group consisting of a hydrogen atom, an alkyl group having 1 to 20 carbon atoms, an aryl group having 6 to 60 carbon atoms, a heterocyclic group having 4 to 60 carbon atoms and cyano group, and n is 0 or 1,

 (2)

wherein, each of $R_4$ and $R_5$ independently is selected from the group consisting of a hydrogen atom, an alkyl group having 1 to 20 carbon atoms, an aryl group having 6 to 60 carbon atoms, a heterocyclic group having 4 to 60 carbon atoms and cyano group,

 (3)

wherein, $Ar_3$ is an arylene group having 6 to 60 carbon atoms in the main chain part thereof or a heterocyclic group having 4 to 60 carbon atoms in the main chain part thereof, $Ar_3$ may have a substituent, however, does not simultaneously have substituents represented by $-Ar_2$ and $-X-R_3$ in the formula (1), each of $R_6$ and $R_7$ independently is selected from the group consisting of a hydrogen atom, an alkyl group having 1 to 20 carbon atoms, an aryl group having 6 to 60 carbon atoms, a heterocyclic group having 4 to 60 carbon atoms and cyano group, k is 0 or 1.

2. The polymeric fluorescent substance according to claim 1, wherein repeating units of formula (1) and repeating units of formula (3) are present in the substance whereby when the absorption edge wavelength of a polymer containing only repeating units of formula (1) is represented by $\lambda_1$ (nm) and the absorption edge wavelength of a polymer containing only repeating units of formula (3) in claim 1 is represented by $\lambda_2$ (nm), the following relation is satisfied:

$$1239/\lambda_2 \geq 1239/\lambda_1 + 0.050.$$

* * * * *